United States Patent [19]
Tsinker

[11] Patent Number: 6,060,890
[45] Date of Patent: May 9, 2000

[54] APPARATUS AND METHOD FOR MEASURING THE LENGTH OF A TRANSMISSION CABLE

[75] Inventor: Vadim M. Tsinker, Belmont, Calif.

[73] Assignee: Advanced Micro Devices, Inc., Sunnyvale, Calif.

[21] Appl. No.: 09/205,585

[22] Filed: Dec. 4, 1998

Related U.S. Application Data

[60] Provisional application No. 60/082,183, Apr. 17, 1998.

[51] Int. Cl.[7] .................................................. G01R 27/26
[52] U.S. Cl. .......................... 324/676; 324/671; 324/678
[58] Field of Search .................................... 324/671, 676, 324/678, 679, 681

[56] References Cited

U.S. PATENT DOCUMENTS

| | | | |
|---|---|---|---|
| 3,530,379 | 9/1970 | Demerliac | 324/60 |
| 3,857,092 | 12/1974 | Meyer | 324/61 R |
| 3,986,108 | 10/1976 | Thomas | 324/60 C |

*Primary Examiner*—Josie Ballato
*Assistant Examiner*—Vincent Q. Nguyen

[57] ABSTRACT

Apparatus for measuring the length of a transmission cable carrying primary and inverted multilevel transmission signals. A counter is arranged to count timing signals from the beginning of the measuring process while a filter extracts a high frequency signal component from the primary and inverted multilevel transmission signals. The extracted high frequency signal component is used to charge a capacitor. A comparator compares the level of charge of the capacitor to a reference level and issues a stop counting signal to the counter when charge of the capacitor equals the reference level. The count of the timing signals in the counter when counting halts is proportional to cable length.

22 Claims, 4 Drawing Sheets

APPARATUS AND METHOD FOR MEASURING THE LENGTH OF A TRANSMISSION CABLE

This invention claims priority from provisional Patent Application Ser. No. 60/082,183, filed on Apr. 17, 1998, entitled "Quad Fast Ethernet Transceiver For 10 Base-T/100 Base-X (QFEX 10/100)" the entire disclosure of which is incorporated by reference herein.

TECHNICAL FIELD

The present invention relates to measuring the length of a cable carrying signals in a transmission medium such as a 100 BASE-TX Ethernet (IEEE standard 802.3u) transmission medium.

BACKGROUND ART

Local area networks use a network cable or other network media to link nodes (e.g., workstations, routers and switches) to the network. Each local area network architecture uses a media access control (MAC) enabling network interface device at each network node to share access to the media.

Physical (PHY) layer devices are configured for translating digital packet data received from a MAC across a standardized interface, e.g., a Media Independent Interface (MII), into an analog signal for transmission on the network medium, and reception of analog signals transmitted from a remote node via the network medium. An example is the 100BASE-TX Ethernet (IEEE Standard 802.3u) receiver, configured for receiving a three-level MLT-3 encoded analog signal (hereafter referred to as MLT3 signal) at a 125 Mb/s data rate. For example, FIGS. 1A, 1B and 1C are diagrams illustrating an original NRZI-encoded digital signal for transmission on the media, an MLT3 signal generated at the transmitting PHY layer for transmission on the network medium, and an MLT3 signal having been transmitted by the network medium and received by a PHY transceiver at a destination node. As shown in FIG. 1A, the original BI-level digital signal, encoded as an NRZI signal, is encoded into the three-level MLT3 signal of FIG. 1B before transmitting the digital information to the receiving station.

On the receiving side, the MLT3 signal of FIG. 1B encounters transmission loss, for example high frequency attenuation caused by the cable, resulting in the received MLT3 signal of FIG. 1C. Since the amount of signal attenuation caused by the cable is directly proportional to the cable length, the recovery of the MLT3 (3 level NRZI) signal depends on correct measurement of the length of the cable.

One manner of determining cable length is to measure the amplitude of the incoming signal. However, in the 100 BASE-TX standard, the incoming MLT3 signal may consist of a variety of pulses ranging from 9 ns to approximately 500 ns in length. Consequently, the frequency content of the data varies. Since the cable attenuates high frequencies more than low frequencies, the amount of attenuation of the incoming pulses will vary based on their length (frequency). For example, a 500 ns pulse will have the same peak amplitude after being transmitted on 100 m of cable as that of a 8 ns pulse after being transmitted on 10 m of cable. Therefore, in order to determine cable length by measuring pulse amplitude, pulse length must also be measured and then compared to the amplitude. Such dual measurement system is quite complicated.

Another manner of determining cable length employs signal edge rate. This method involves measuring the rise or fall time of the signal in order to determine the length of the cable the signal has traversed. The longer the cable, the slower the rise/fall time of the signal will be. The advantage of this method is that it is independent of the frequency of the incoming data; only the rise or fall time of the signal matters. However, the disadvantage of this method is that it involves the measurement of very small time quantities; e.g., signal rise time could be as short as 3 ns, which requires a very precise timer in order to detect the difference between rise times after various cable lengths. Another disadvantage is that this method requires some amplitude measurement also since a rise time is a measurement of the change of signal amplitude vs. time. Finally, noise on a specific signal edge may change the measurement result, so several measurements need to be made and averaged in order to obtain the correct cable length.

SUMMARY OF THE INVENTION

There is a need for an arrangement which allows the length of cable traversed by a transmitted signal to be measured without requiring measurement of the amplitude or the precise rise/fall time of the signal.

This and other needs are attained by the present invention where a first circuit outputs a ramp signal changing at a rate corresponding to a high frequency content of primary and inverted multilevel transmission signals carried by a transmission cable, and a second circuit correlates the rate of change of the ramp signal with cable length.

According to one aspect of the present invention, the first circuit comprises a filter extracting a high frequency signal component from the primary and inverted multilevel transmission signals carried by the cable.

In another aspect of the present invention, the second circuit comprises a charging element arranged to be charged by the high frequency signal component extracted by the filter and a third circuit configured to determine when a level of charge of the charging element reaches a reference level. The third circuit includes a comparator comparing the level of charge of the charging element to the reference level, and a counter connected to the comparator and receiving timing signals. The counter counts the timing signals and the comparator issues a counting stop signal to the counter when the level of charge of the charging element equals the reference level. The count of the timing signals in the counter when counting stops is proportional to cable length.

A another aspect of the present invention provides a method of measuring the length of a transmission cable by outputting a ramp signal changing at a rate corresponding to a high frequency content of primary and inverted multilevel transmission signals carried by the transmission cable, and correlating the rate of change of the ramp signal with cable length.

In yet a further aspect of the present invention, outputting a ramp signal includes extracting a high frequency signal component from the primary and inverted multilevel transmission signals carried by the cable, and charging a charging element using the extracted high frequency signal component.

In still yet another aspect of the present invention, correlating the rate of change of the ramp signal with cable length includes determining when a level of charge of the charging element reaches a reference level by comparing the level of charge of the charging element to the reference level and counting timing signals until the level of charge of the charging element equals the reference level. The counted timing signals when the level of charge of the charging element equals the reference level is proportional to cable length.

Thus, the present invention allows the length of cable traversed by a transmitted signal to be measured without measuring the amplitude or the precise rise/fall time of the signal.

Additional objects, advantages and novel features of the invention will be set forth in part in the description which follows, and in part may become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

Reference is made to the attached drawings, wherein elements having the same reference numeral designations represent like elements throughout and wherein.

BEST MODE FOR CARRYING OUT THE INVENTION

Figure 1A:
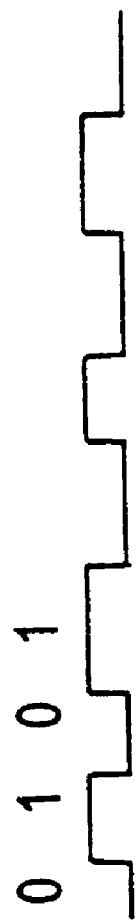
FIGS. 1A, 1B, and 1C are diagrams illustrating an NRZI-encoded signal, an MLT3 signal generated by a transmitting station, and an MLT3 signal at a receiving station having encountered propagation losses, respectively.
Figure 1B:
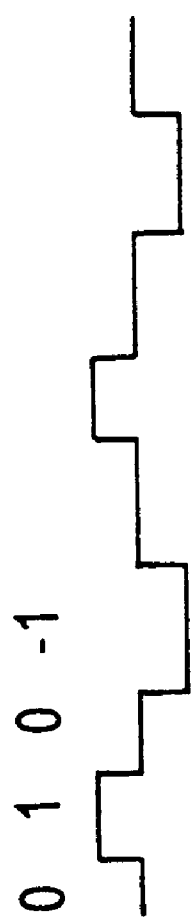
Figure 1C:
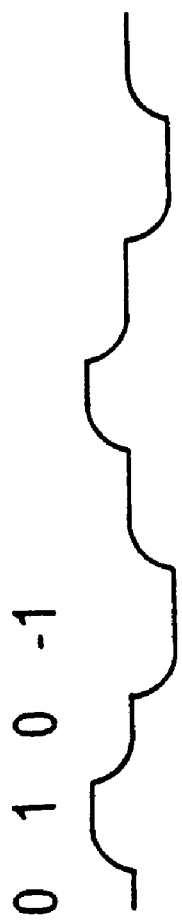
Figure 2:
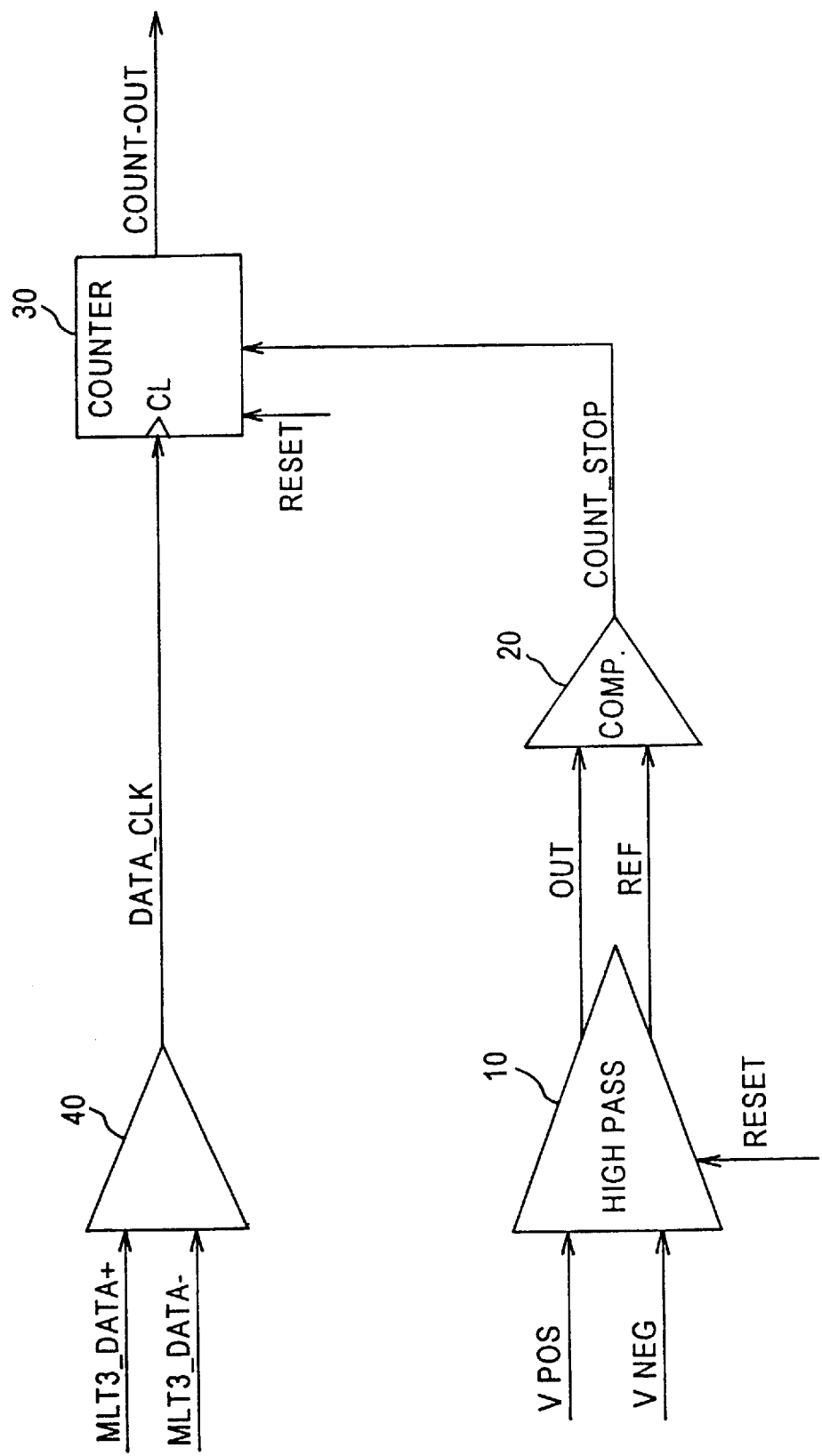
FIG. 2 is a block diagram illustrating apparatus for measuring the length of a transmission cable in accordance with the present invention.
Figure 5:
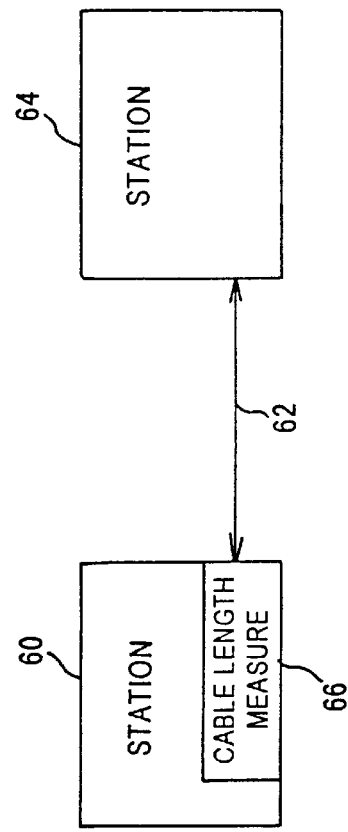
FIG. 5 is a diagram illustrating use of the apparatus for measuring the length of a transmission cable.

FIG. 2 is a block diagram illustrating apparatus for measuring the length of a transmission cable in accordance with the present invention. FIG. 5 is a diagram illustrating use of the apparatus for measuring the length of a transmission cable. Data for a LAN network is output as a differential output pair. The apparatus of FIG. 2 includes a high pass circuit 10 configured to receive a primary multiple level transmission signal (VPOS) and an inverted multiple level transmission signal (VNEG). VPOS and VNEG are a differential pair of voltages received on the transmission line corresponding to the differential data pair of MLT3 data transmitted by the network. Both VPOS and VNEG have high and low frequency components. High pass circuit 10 extracts the high frequency signal component of these signals and the extracted high frequency signal component is used to provide a ramp (voltage) output signal OUT. High pass circuit 10 also provides a reference signal REF.

Figure 4:
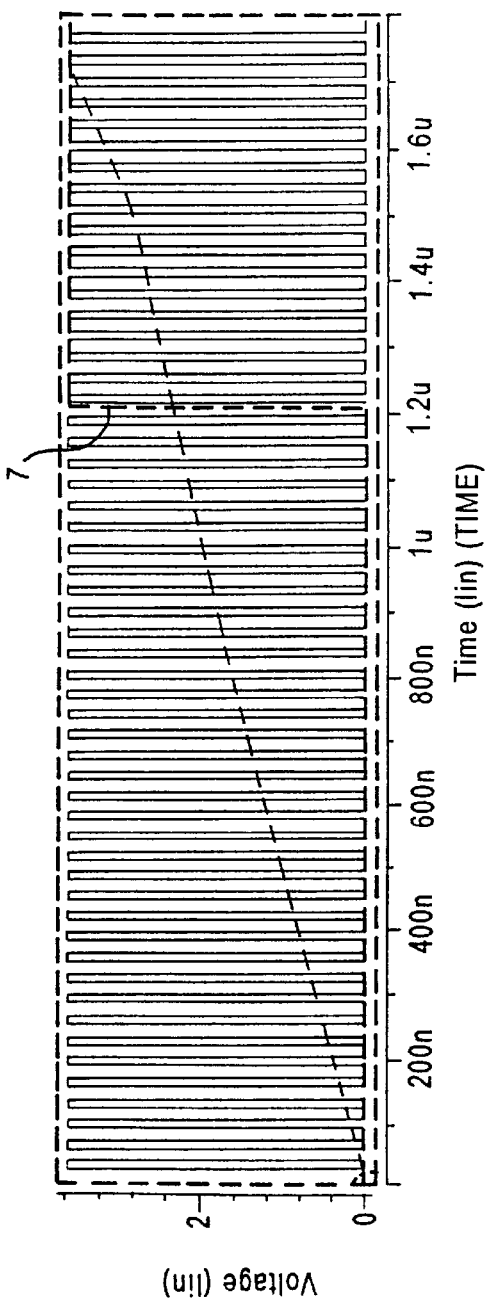
FIG. 4 is a diagram illustrating the ramp signal generated by the high pass filter of FIG. 3.

A digital counter 30 is used to measure the time for the ramp (voltage) signal OUT to rise to the threshold reference REF from a beginning of a measurement process. Threshold reference REF is the level which initiates a rising edge 7 of the received pulse as shown in FIG. 4. Consequently, at the beginning of a measurement process, both the ramp signal OUT and the content of the digital counter 30 are reset to zero by inputting the signal RESET to both high pass circuit 10 and digital counter 30. After being reset to zero, digital counter 30 begins to count timing signals DATA_CLK provided to input port CL. When the ramp signal OUT rises to the threshold level REF, as determined by comparator 20, a COUNT_STOP signal is provided to digital counter 30 to halt counting of the timing signals. The count value in digital counter 30 when counting is halted is proportional to the cable length as explained more fully below.

Figure 3:
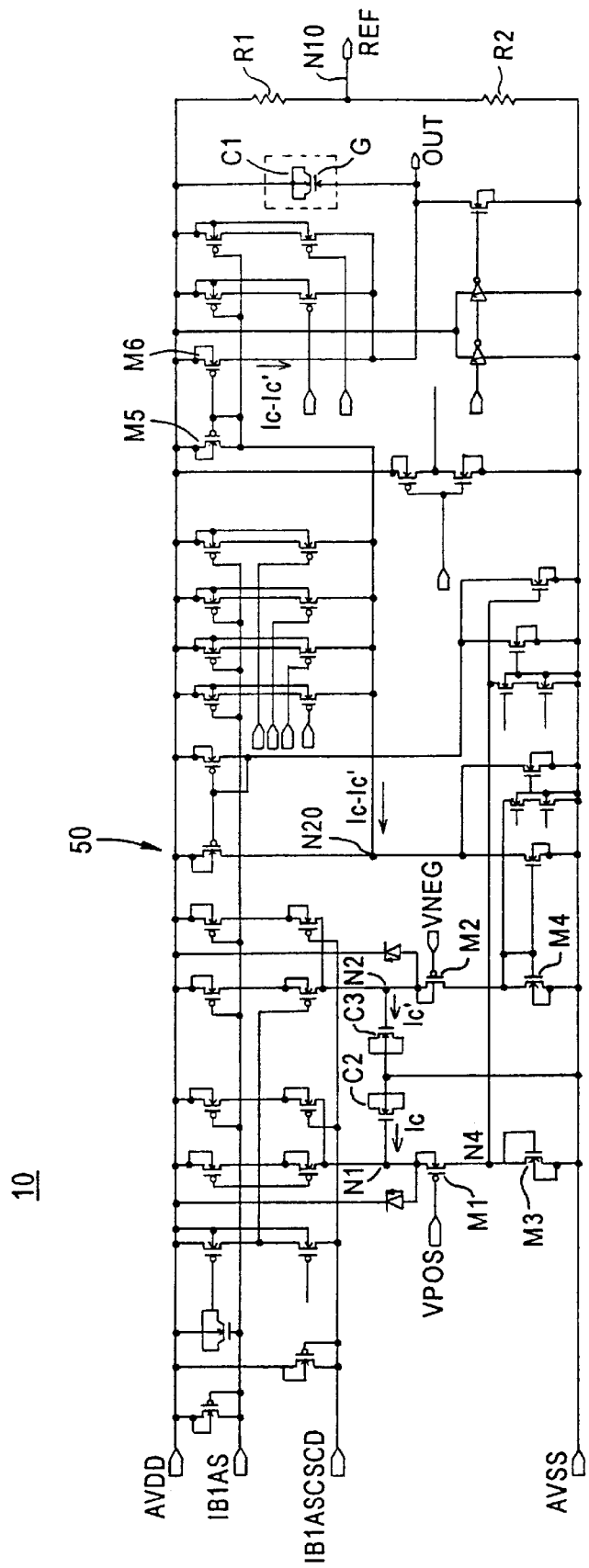
FIG. 3 is a schematic diagram illustrating in detail the high pass filter of FIG. 2.

FIG. 3 is a schematic diagram illustrating in detail an example of the high pass circuit 10 of FIG. 2. The high pass circuit 10 comprises a high pass filter portion 50 connected to charge a capacitor C1. The high pass filter portion 50 comprises a single zero high pass filter. Capacitors C2 and C3 (C2=C3) are MOS devices each having one end connected to ground AVSS and another end connected to a corresponding node N1, N2. The positive voltage VPOS of the differential input voltage VPOS−VNEG is input to MOS transistor M1 having one conductor connected to node N1 and another conductor connected to a conductor of MOS transistor M3. The negative voltage VNEG of the differential input voltage VPOS−VNEG is input to MOS transistor M2 having one conductor connected to node N2 and another conductor connected to a conductor of MOS transistor M4. Those skilled in the art will recognize that each of nodes N1 and N2 is also connected to a respective constant current source. This arrangement allows a conversion of the input differential voltage VPOS−VNEG into current Ic. Thus, current Ic flows to node N1 and differential current Ic flows from node N2. During an edge in the differential signal, a spike in the current Ic will occur as a result of the voltages VPOS−VNEG. Current Ic, after passing through MOS transistors M1 and M3, will be subtracted at node N20 from its differential complementary current Ic', which passes through MOS transistors M2 and M4. The current, directly proportional to differential current Ic−Ic' is mirrored in MOS transistors M5 and M6. This mirrored current is used to charge the gate G of capacitor C1 resulting in the voltage ramp signal OUT being output. Resistor R1 is connected between the power supply AVDD and output terminal N10 and resistor R2 (R1=R2) is connected between ground AVSS and output terminal N10. Consequently, reference voltage REF is output from output terminal N10.

The rate at which capacitor C1 is charged is directly related to the length of cable signals via differential input voltage VPOS−VNEG. Since, as noted earlier, the amount of signal attenuation caused by a cable is directly proportional to the cable length, i.e., the shorter the cable the less the signals will be attenuated. More specifically, the less the incoming signals are attenuated, the sharper their edges will be and thus, the greater will be their high frequency content. The greater the high frequency content of the incoming signals, the larger the current spikes Ic and Ic' will be and the faster the capacitor C1 will be charged to the threshold reference level REF. Thus, the shorter the transmission cable carrying the incoming primary and inverted multiple level transmission signals, the lower will be the count in the digital counter 30 when counting is halted since capacitor C1 will rise to the reference level REF faster than when the transmission cable is longer. As noted earlier, the count in the digital counter 30 when counting is halted is directly proportional to the length of the transmission cable.

However, the rate of change of the ramp signal OUT depends also on the rate at which the data are received (data rate). More precisely, the faster the data is coming in on the transmission cable, the faster the ramp signal OUT will rise to the threshold level REF even though the cable length may be long. Similarly, the slower the data is coming in on the transmission cable, the slower the ramp signal OUT will rise to the threshold level REF even though the cable length may be short. Therefore, it is not possible to have a fixed clock (timing signals) for the digital counter 30.

Referring again to FIG. 2, in view of the dependence of the rate of change of the ramp signal OUT on the data rate, receiver 40 is provided to receive data signals MLT3_DATA+ and MLT3_DATA−, output from a differential line equalizer (not shown), and generate a data dependent clock signal DATA_CLOCK dependent on the data rate. When the data rate of the received data is slow, the ramp signal OUT will rise slower than when the data rate is fast. However, digital counter 30 will be clocked slower since receiver 40 will generate the data dependent clock signals DATA_CLOCK at a slow rate as a result of the slow data rate. Similarly, if the data rate of the received data is fast, the ramp signal OUT will rise faster than when the data rate is slow. However, digital counter 30 will be clocked faster since receiver 40 will generate the data dependent clock signals DATA_CLOCK at a fast rate as a result of the fast data rate. Consequently, the overall count is the same. The receiver 40 can be any known decoder for decoding a differential pair of multiple level signals (MLT3 signals) from a line equalizer.

The count in digital counter 30 can be provided to a converter circuit (not shown), which may be a computer circuit, to convert the count in digital counter 30 to cable length. FIG. 5 is a diagram illustrating use of the apparatus for measuring the length of a transmission cable. As shown in FIG. 5, a station 60 is connected to a station 64 via a transmission cable 62. Included in station 60 is cable length measuring circuit 66 which would include the apparatus of FIG. 2. The elements of FIG. 5 can be, for example, part of a Local Area Network (LAN) communications system an example of which is an Ethernet network. Ethernet protocol provides for a Media Access Control (MAC), enabling network interface devices at each network node to share accesses to the network medium. One type of connection, termed a Media Independent Interface, or MII, connects the MAC to a physical layer (PHY) transceiver which is configured for a particular network medium, e.g., 10 BASE-T, 100 BASE-FX, or 100 BASE-TX. The PHY transceiver converts the MII protocol signals output by the MAC into analog network signals, e.g., MLT3 signals for 100 Mb/s Ethernet networks, or Manchester-encoded signals for 10 Mb/s Ethernet networks. Networks often use several PHY devices operating over different media types. Station 60 can be part of a PHY transceiver and station 64 can be part of another PHY transceiver, repeater, etc.

In such a LAN, the MLT3 signals received by station 60 need to be recovered to 3 level NRZI signals. However, as noted earlier, since the MLT3 signals encounter high frequency attenuation in an amount directly proportional to the length of transmission cable 62, recovery of the received MLT3 signals to 3 level NRZI signals depends on the correct measurement of the length of the cable by cable length measuring circuit 66.

There accordingly has been described apparatus and method allowing the length of cable carrying transmitted signals to be measured without the need to measure the amplitude or the precise rise/fall time of the signal. The apparatus of the present invention provides a simple method for measuring the length of a transmission cable while employing low precision analog circuits. The rise rate of the ramp signal OUT is relatively insensitive to variations in the high-pass filter resulting from processing since capacitors C2 and C3 are matched to capacitor C1. Several pulses are measured to determine cable length which implies automatic averaging and eliminates single edge measure errors. The apparatus provides greater measurement resolution than either of the previously described prior art methods of determining cable length, i.e., by measuring the amplitude of the incoming signal or using signal edge rate.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. Apparatus for measuring the length of a transmission cable carrying primary and inverted multilevel transmission signals, the apparatus comprising:
    a first circuit outputting a ramp signal changing at a rate corresponding to a high frequency content of the primary and inverted multilevel transmission signals; and
    a second circuit correlating the rate of change of the ramp signal with cable length.

2. The apparatus according to claim 1, wherein the first circuit comprises a filter extracting a high frequency signal component from the primary and inverted multilevel transmission signals carried by said cable.

3. The apparatus according to claim 2, wherein the second circuit comprises:
    a charging element arranged to be charged by said high frequency signal component extracted by the filter; and
    a third circuit configured to determine when a level of charge of said charging element reaches a reference level.

4. The apparatus according to claim 3, wherein the third circuit comprises:
    a comparator comparing the level of charge of said charging element to the reference level; and
    a counter connected to said comparator and receiving timing signals.

5. The apparatus according to claim 4, wherein
    the counter is responsive to receipt of the timing signals by counting the timing signals, and
    said comparator is configured to issue a counting stop signal to the counter when the level of charge of said charging element equals the reference level, the count of the timing signals in the counter when the counting step signal is received by the counter is proportional to cable length.

6. The apparatus according to claim 5, wherein the timing signals are data dependent timing signals.

7. The apparatus according to claim 5, wherein
    the multilevel transmission signals comprise differential voltage signals,
    the filter includes circuitry for converting the differential voltage signals into differential current, the difference of said differential current charging said charging element.

8. Apparatus for measuring the length of a transmission cable carrying primary and inverted multilevel transmission signals, the apparatus comprising:
    a high pass filter extracting a high frequency signal component from the primary and inverted multilevel transmission signals carried by said cable;
    a capacitor arranged to be charged by said high frequency signal component extracted by the filter; and
    a circuit configured to correlate a level of charge of said capacitor with cable length.

9. The apparatus according to claim 8, wherein the circuit configured to correlate a level of charge of said capacitor with cable length comprises:
    a comparator comparing the level of charge of said capacitor to a reference voltage; and
    a counter connected to said comparator and receiving clock signals.

10. The apparatus according to claim 9, wherein said counter count includes circuitry to count the clock signals and stop counting when an output of the comparator indicates that the level of charge of said capacitor equals the reference voltage, the count of the clock signals in the counter when counting stops being proportional to cable length.

11. The apparatus according to claim 10, wherein the clock signals are data dependent clock signals.

12. The apparatus according to claim 10, wherein the multilevel transmission signals comprise differential voltage signals, the high pass filter includes circuitry for converting the differential voltage signals into differential current, a difference of said differential current charging said capacitor.

13. A method of measuring the length of a transmission cable carrying primary and inverted multilevel transmission signals, comprising:

generating a ramp signal changing at a rate corresponding to a high frequency content of the primary and inverted multilevel transmission signals; and correlating the rate of change of the ramp signal with cable length.

14. The method according to claim 13, wherein generating a ramp signal comprises:

extracting a high frequency signal component from the primary and inverted multilevel transmission signals carried by said cable, and charging a charging element using the extracted high frequency signal component.

15. The method according to claim 14, wherein correlating the rate of change of the ramp signal with cable length comprises:

determining when a level of charge of said charging element reaches a reference level.

16. The method according to claim 15, wherein determining when a level of charge of said charging element reaches a reference level comprises:

comparing the level of charge of said charging element to the reference level; and counting timing signals until the level of charge of said charging element equals the reference level, the counted timing signals when the level of charge of said charging element equals the reference level is proportional to cable length.

17. The method according to claim 16, wherein the timing signals are data dependent timing signals.

18. The method according to claim 16, wherein the multilevel transmission signals comprise differential voltage signals, and extracting a high frequency signal component includes
converting the differential voltage signals into differential current, and charging said charging element with a difference of said differential current.

19. A method of measuring the length of a transmission cable carrying primary and inverted multilevel transmission signals, the apparatus comprising:

extracting a high frequency signal component from the primary and inverted multilevel transmission signals carried by said cable;

charging a capacitor using said high frequency signal component extracted by the filter; and correlating a level of charge of said capacitor with cable length.

20. The method according to claim 19, wherein correlating a level of charge of said capacitor with cable length comprises:

comparing the level of charge of said capacitor to a reference voltage; and counting clock signals until the level of charge of said capacitor equals the reference level, the count of the clock signals when the level of charge of said capacitor equals the reference level being proportional to cable length.

21. The method according to claim 20, wherein the clock signals are data dependent clock signals.

22. The method according to claim 20, wherein the multilevel transmission signals comprise differential voltage signals, and extracting a high frequency signal component includes
converting the differential voltage signals into differential current, and charging said capacitor using a difference of said differential current.

* * * * *